(12) United States Patent
Groves et al.

(10) Patent No.: US 6,296,976 B1
(45) Date of Patent: Oct. 2, 2001

(54) COMPENSATION OF WITHIN-SUBFIELD LINEWIDTH VARIATION IN E-BEAM PROJECTION LITHOGRAPHY

(75) Inventors: Timothy R. Groves, Fulbourn (GB); Steven D. Golladay, Hopewell Junction, NY (US); Hans C. Pfeiffer, Ridgfield, CT (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/333,931

(22) Filed: Jun. 16, 1999

(51) Int. Cl.⁷ .......................................................... G03F 9/00
(52) U.S. Cl. .............................. 430/30; 430/296; 430/942
(58) Field of Search ..................................... 430/296, 942, 430/30

(56) References Cited

U.S. PATENT DOCUMENTS 5,700,604 * 12/1997 Okino .................................... 430/296
5,935,744 * 8/1999 Nakajima ............................. 430/296

\* cited by examiner

*Primary Examiner*—Christopher G. Young
(74) *Attorney, Agent, or Firm*—McGuireWoods, LLP (57) ABSTRACT

A method for improving image fidelity on a resist. The method adjusts the intensity distribution of the electron beam such that the feature size at the edges and the center of a subfield have a same width "w". This is accomplished by intentionally increasing the incident intensity where the images are small (more pronounced blurring), and intentionally decreasing the incident intensity where the images are large (less pronounced blurring). This can be achieved, for example, by maintaining a cathode temperature profile which increases or decreases radially by an appropriate amount.

26 Claims, 6 Drawing Sheets

COMPENSATION OF WITHIN-SUBFIELD LINEWIDTH VARIATION IN E-BEAM PROJECTION LITHOGRAPHY

BACKGROUND OF THE INVENTION

1. Field of the Invention

The present invention generally relates to a method for improving image fidelity on a semiconductor wafer and more particularly, to a method of controlling electron beam intensity of an electron beam projection lithography system in order to provide a uniform feature size throughout a subfield of a resist pattern.

2. Background Description

Semiconductor manufacturers typically use lithographic processes in a highly specialized printing process to put detailed patterns onto silicon wafers. In general, a layer of photosensitive material called "resist" is deposited onto a silicon wafer and an image containing the desired pattern of energy or charged particles is projected onto the silicon wafer. After development, the resist forms a stenciled pattern (e.g., image) across the wafer surface that matches the desired pattern of a circuit.

More specifically, in electron beam lithography, finely focused electron beams are emitted from a cathode surface and through a series of optical lenses and a patterned reticle in order to provide a fine line pattern or image on the resist surface. In common practice, a 4x reticle is electron optically imaged and then demagnified onto the writing surface (e.g., resist). In common practice, the 4x reticle includes a square subfield of 1 mm width which results in a 0.25 mm wide subfield image on the resist. However, 1x, 2x, 3x, etc. reticles may also be used in lithographic systems.

Figure 1:
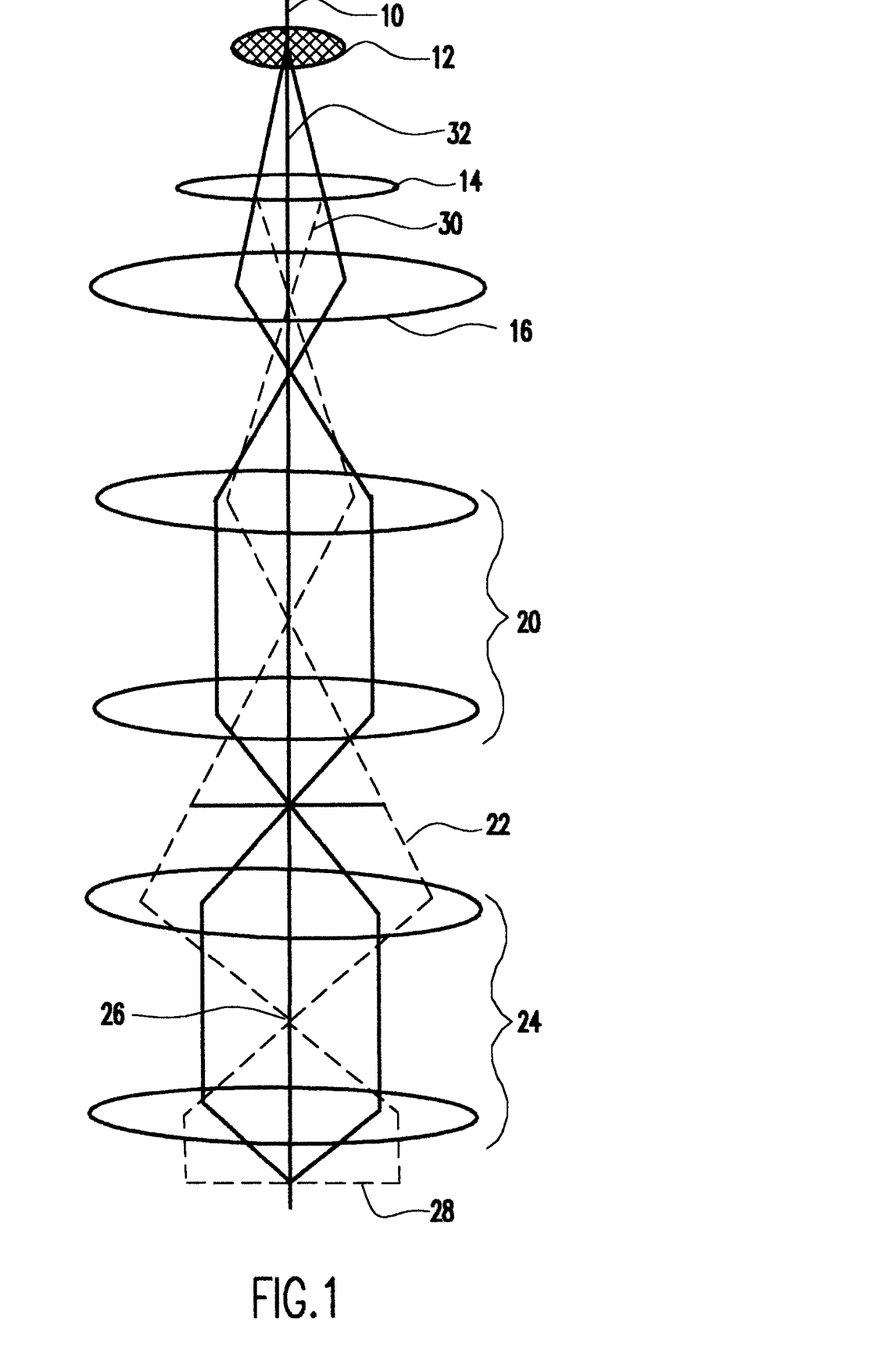
FIG. 1 is an electron beam lithographic system.

FIG. 1 shows an electron-beam apparatus of common design. Specifically, in the apparatus of FIG. 1, electrons are emitted from a hot cathode, for example, approximately 1700° K, in a highly uniform intensity distribution. The electrons are then emitted from a charged particle emitting device 10, for example, a crystal, forming an electron beam 12 having a uniform intensity distribution. The electron beam 12 passes through a series of optics (e.g., auxiliary lens 14, condenser 16 and an illuminator doublet 20) prior to being optically imaged on a reticle 22 and then demagnified onto the target 28 (e.g., resist). Prior to the electron beam being demagnified onto the target 28, it first passes through a series of optics (e.g., projection doublet 24 and contrast aperture 26) to ensure proper focus of the electron beam 12 onto the target 28. The dashed lines 30 of FIG. 1 represent lateral areas being imaged and the solid vertical line 32 of FIG. 1 represents an ideal path for the electron beam 10.

A typical problem presented with the use of electron beam lithography is degradation of image fidelity due to naturally occurring electron optical aberrations occurring within the subfield. Aberrations are typically defined as the variation of pixel size and usually vary symmetrically in the radial direction about the subfield center.

Aberrations usually arise from two sources: (i) geometric field aberrations of the focusing and deflection system, and (ii) space charge interaction within the beam. Geometric field aberrations are independent of the pattern being printed on the wafer surface and are predictable by computation in the limit where the system is well aligned, and a stigmatic image is obtained on the central axis. However, aberrations caused by space charge interaction depend on the pattern being printed on the wafer surface insofar as this determines the local current density within the electron beam path which, in turn, governs the space charge interaction. Aberrations caused by space charge interaction are also predictable by computation. The resultant field aberration arising from both (i) geometric field aberrations and (ii) space charge interaction are measurable for a given set of operating conditions.

Aberrations cause image blurring which effects the intensity distribution or exposure dose (intensity×time) in the image which, in turn, also affects the printed line width on the resist. Blurring is generally manifested as a gray level phenomenon and occurs when the image is not completely developed on the resist.

As the blurring increases, the intensity (or exposure dose) is spread over a wider area and the intensity of the center of the feature decreases. This leads to a narrowing of the printed image because of the dose threshold for full development and the high contrast nature of the preferred resists. If the blurring is sufficiently pronounced, the image may not print at all as the central intensity becomes insufficient to expose the resist.

It is common practice to compensate for image size variations in the reticle by choosing feature sizes in the reticle to compensate for these variations. This necessitates incorporating the image size information at the reticle fabrication step which significantly increases the complexity of the overall process. Furthermore, the reticle can not be changed once it is fabricated, and if the reticle needs to be changed, the entire process must be stopped. This greatly increases manufacturing costs and time.

SUMMARY OF THE INVENTION

It is therefore an object of the present invention to provide a method for increasing or decreasing feature size on a resist.

It is a further object of the present invention to provide a method for compensating for naturally occurring aberrations thereby providing increased resist image fidelity.

It is still another object of the present invention to eliminate the deleterious effect of blurring in a resist image.

It is also a further object of the present invention to provide a method for controlling electron beam intensity in order to provide a uniform feature size throughout a subfield of a resist.

The present invention describes a method and apparatus for improving image fidelity on a resist. More specifically, the method of the present invention provides for uniform feature size throughout the subfield of a resist by choosing the incident intensity distribution within the subfield such that the printed size is compensated at each point. This is accomplished by intentionally increasing the incident intensity where the images are small (more pronounced blurring), and intentionally decreasing the incident intensity where the images are large (less pronounced blurring).

In one such embodiment, the energy of the electron beam is selectively increased about the edges of the electron beam causing a non-uniform intensity distribution about the electron beam. This causes the intensity of the electron beam to raise above the threshold intensity level at the edges of the electron beam such that the feature size at the edges of the subfield become equal to the feature size at the center of the subfield. This can be achieved, for example, by maintaining a cathode temperature profile which increases radially by an appropriate amount.

In order to increase or decrease the intensity distribution within an electron beam about the edges or center of the electron beam (e.g., local intensity distribution adjustment), the temperature of the cathode is selectively adjusted about either the edges or center of the cathode, respectively. The temperature of the cathode is selectively adjusted about either the edges or center of the cathode, by bombarding the cathode with bombardment electron beams locally on the edges or center of the backside (non-emitting side) of the cathode, respectively. Due to the local bombardment on the backside of the cathode, the local intensity about the edges or center of the electron beam may thus be adjusted accordingly.

The apparatus of the present invention includes a first cathode emitting an electron beam, having an intensity distribution, on a resist layer. The apparatus further includes an adjusting device for adjusting the intensity distribution of the electron beam such that the intensity distribution of the electron beam is non-uniform in subfields of the resist layer of the electronic device. The adjusting device may include a center and/or annular cathodes which emit bombardment electrons on a backside (non-emitting) side of the first cathode. The emitting of the bombardment electrons will selective increase the temperature about portions of the first cathode which, in turn, increases the intensity distribution of the electron beam about those selective portions of the first cathode.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a method of improving image fidelity on a patterned resist. More specifically, the present invention is directed to a method of providing a uniform patterned image on a resist by compensating for naturally occurring aberrations.

It is conventional wisdom to provide a uniform illumination intensity distribution throughout the subfield of a resist. However, when attempting to provide a uniform illumination intensity distribution throughout the subfield of a resist, the outer edges of the cathode are generally cooler than the inner portions of the cathode thus resulting in a more intense electron beam distribution about the center of the electron beam and a less intense electron beam distribution about the edges of the electron beam. This, in turn results in degradation of image fidelity on the resist especially at the outer edges of a subfield being exposed.

The method of the present invention greatly improves the resist image fidelity throughout the subfield by choosing the incident intensity distribution within the subfield such that the printed feature size is compensated by adjustment of intensity at each point throughout the subfield. In other words, the method of the present invention (i) intentionally increases the incident intensity where the images are small and at subfield edges (more pronounced blurring), and (ii) intentionally decreases the incident intensity where the images are large and centrally located in the subfield(less pronounced blurring). Thus, by choosing the incident intensity distribution within the subfield the systematic variations of the feature size of the patterned image can thus be eliminated.

Figure 2:
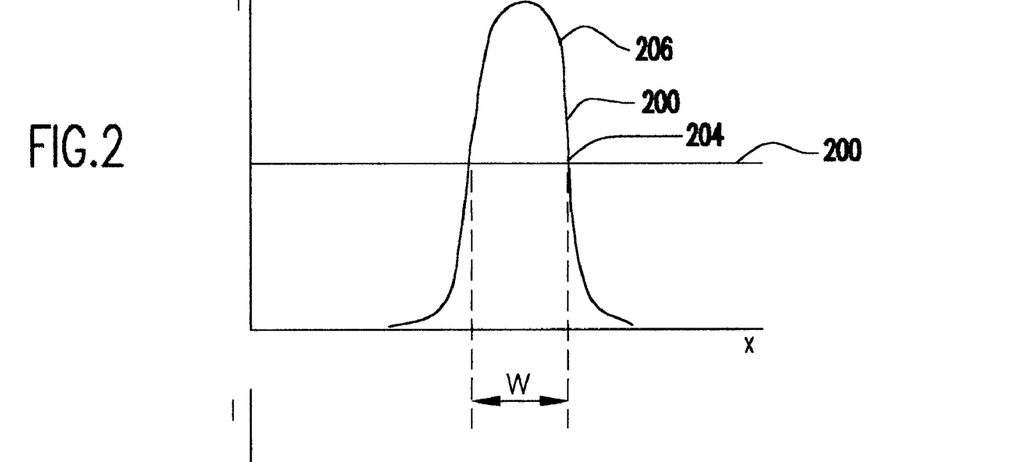
FIG. 2 shows an ideal intensity distribution of an electron beam about a center of a subfield using a uniform intensity distribution.

Referring now to the drawings, and more particularly to FIG. 2, there is shown an optimally focused Gaussian distribution (e.g., ideal distribution) of an electron beam for a pattern feature. FIG. 2 represents a Gaussian distribution for an electron beam having a uniform intensity used with a conventional system, such as shown in FIG. 1.

Specifically, FIG. 2 shows an intensity level on the vertical axis and a measurement of feature size on the horizontal axis. A horizontal line 200 represents an exposure intensity threshold level (hereinafter referred to as an intensity threshold level) such that any intensity level above the intensity threshold level 200 would result in an exposed resist and any intensity level below the intensity threshold level 200 would result in unexposed resist at the corresponding location. It is well understood by one of ordinary skill in the art that an intensity level below the intensity threshold level 200 will result in the image not printing (e.g., due to blurring).

Referring still to FIG. 2, a curve 206 representing a pixel shape intersects the intensity threshold level 200 at intersection points 204. The area below the curve 206 represents the energy of the electron beam, and the distance between the intersection points 204 on the intensity threshold level 200 represents the width "w" of a printed feature (e.g., 80 nm).

As further seen in FIG. 2, due to the shape of the curve 206, the intensity of the electron beam is limited to an area substantially equal to the width "w" of the printed feature as seen from the distribution of the curve 206 on the horizontal axis "x". Thus, the area represented by "w" represents the width of the printed feature, while the areas outside the "w" do not represent a printed feature.

Figure 3:
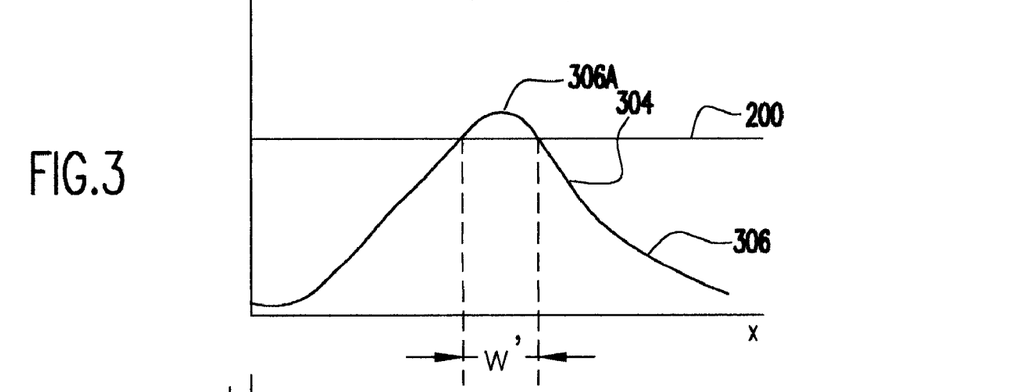
FIG. 3 shows an intensity distribution of a blurred electron beam about edges of a subfield occurring in a uniform intensity distribution.

FIG. 3 shows the intensity distribution of the electron beam about the edges of the same subfield as shown in FIG. 2. Thus, similar to FIG. 2, FIG. 3 represents a Gaussian distribution for an electron beam having a uniform intensity distribution across the entire subfield. It is important to note that FIG. 3 is a non-ideal intensity distribution which results in degradation of resist image fidelity about the edges of the exposed subfield, as discussed below.

Specifically, FIG. 3 shows a curve 306 representing a pixel shape at the edges of the subfield. The curve 306 is flatter and wider than the curve 206 of FIG. 2, and shows the intensity of the electron beam spreading over a broader area (as seen from the distribution of the curve 306 on the horizontal axis "x") due to blurring. The area under the curve 306 represents the total energy of the system and is equal to the energy under the curve 206 of FIG. 2; however, the curve 206 represents the intensity distribution of the electron beam at the center of the subfield whereas the curve 306 represents the intensity distribution of the electron beam at the edges of the subfield. It is well understood by one of ordinary skill in the art that the intensity distribution of FIGS. 2 and 3 thus represents a uniform intensity distribution about an entire subfield, including the center and edges thereof.

The flatter and wider curve 306 of FIG. 3 has a peak 306a which rises only slightly above the intensity threshold level 200 (which is the same as the intensity threshold level 200 of FIG. 2). This results in a broader curve 306, much of which resides below the threshold level 200, and where only a small portion of the peak 306a rises above the intensity threshold level 200. Because of the shape of the curve (and energy distribution of the electron beam), the printed feature is smaller about the edges of the subfield than at the center of the subfield as seen by the feature width "w'" (FIG. 3) being narrower than the feature width "w" (FIG. 2). Thus, similar to FIG. 2, the area represented by "w'" represents the width of the printed feature while the areas outside the "w" do not represent printed features.

As can thus be envisioned from FIGS. 2 and 3, image fidelity using the conventional uniform intensity distribution of an electron beam is thus degraded due to the varying feature sizes "w" and "w'". Also, blurring increases (as compared to FIG. 2) since the intensity is spread over a wider area.

It is also important to note at this time that the intensity threshold level 200 may vary depending on the type of resist used with the method of the present invention, and that the type of resist used is not critical to the understanding of the present invention. Thus, the intensity threshold level 200 may represent an intensity threshold of greater or lesser value, and would be known to one of ordinary skill in the art prior to using the method of the present invention.

Figure 4:
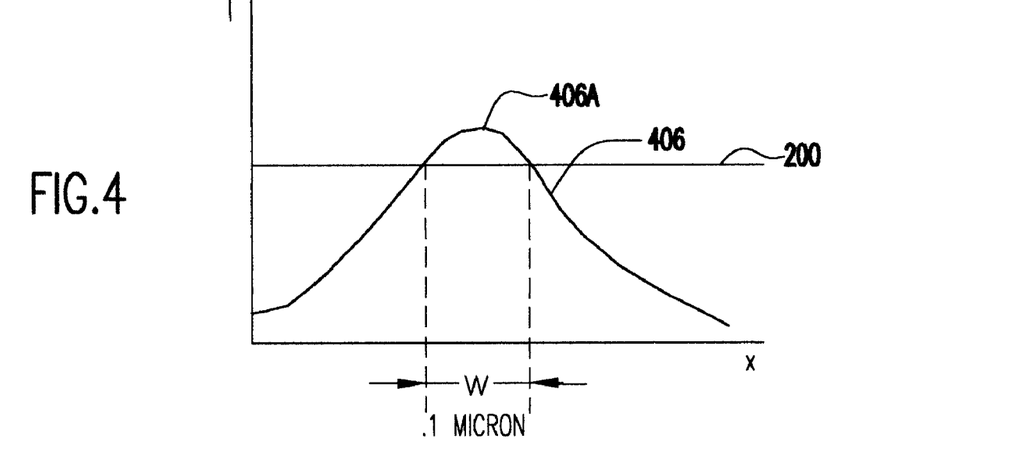
FIG. 4 shows an intensity distribution of a blurred electron beam about edges of a subfield occurring in a non-uniform intensity distribution.

FIG. 4 shows a intensity distribution of an electron beam about edges of a subfield using a non-uniform intensity distribution in accordance with the invention. In combination with FIG. 2, the method of the present invention provides for an ideal intensity distribution throughout the subfield, whereby image fidelity is greatly enhanced due to uniform feature size throughout the subfield.

In order to provide for an ideal intensity distribution of an electron beam about the edges of the subfield, the method of the present invention selectively adjusts the intensity of the electron beam in the vicinity of the edges thereof (e.g., adjusts local intensity distributions within the electron beam). Thus, the distribution of the electron beam becomes non-uniform about the entire electron beam such that the intensity of the electron beam at the center may be less than the intensity of the electron beam at the edges thereof. This can be achieved, for example, by maintaining a cathode temperature profile which increases radially by an appropriate amount.

In the alternate embodiment, the method of the present invention selectively adjusts the intensity of the electron beam about the center thereof so that the intensity of the electron beam at the edges may be less than the intensity of the electron beam at the center thereof.

Referring again to FIG. 4, the energy of the electron beam of FIG. 4 is increased in comparison to FIG. 3, as seen by the increased area under the curve 406. This increased energy raises the peak 406a of the curve 406 above the intensity threshold level 200 as compared to FIG. 3. (The intensity threshold level 200 of FIG. 4 is the same as the intensity threshold level 200 of FIGS. 2 and 3.) The increased energy of the electron beam, in turn, results in an increased exposure of the resist in the subfield, thereby increasing the printed feature size at the edges and improving the image fidelity of the image. Even though the energy of the electron beam is increased in FIG. 4 as compared to FIG. 3, the shape of the pixel (as represented by the curves 306, 406) remains the same.

Thus, as seen graphically in FIG. 4, the width "w" of the printed feature of FIG. 3 is the same as the width "w" of the printed feature of FIG. 2, which represents an ideal intensity distribution. In other words, the printed feature size at the center of the subfield is now the same size as the printed feature size at the edges of the subfield thus restoring image fidelity to the patterned image. Thus, as seen in FIG. 4, by increasing the illumination intensity as a function of radial distance from the subfield center, image size variations (e.g., aberrations) can be corrected. It is thus expected that without some form of compensation, the image size arising from blurring will be excessively small as depicted in FIG. 3.

Although not critical to the understanding of the method of the present invention, one of ordinary skill in the art would note that the curve 406 (FIG. 4) and the curve 306 (FIG. 3) are similar in shape; however, the area under the curve 406 is larger than the area under the curve 306. What is critical to the understanding of the present invention is that this larger area (e.g., higher energy), raises the peak 406a of curve 406 above the intensity threshold level 200 thus resulting in printed feature size "w" about the center and edges of the subfield. Hence, since the printed feature size "w" about the center and the edges of the subfield are the same, image quality is greatly improved.

Figures 5, 6:
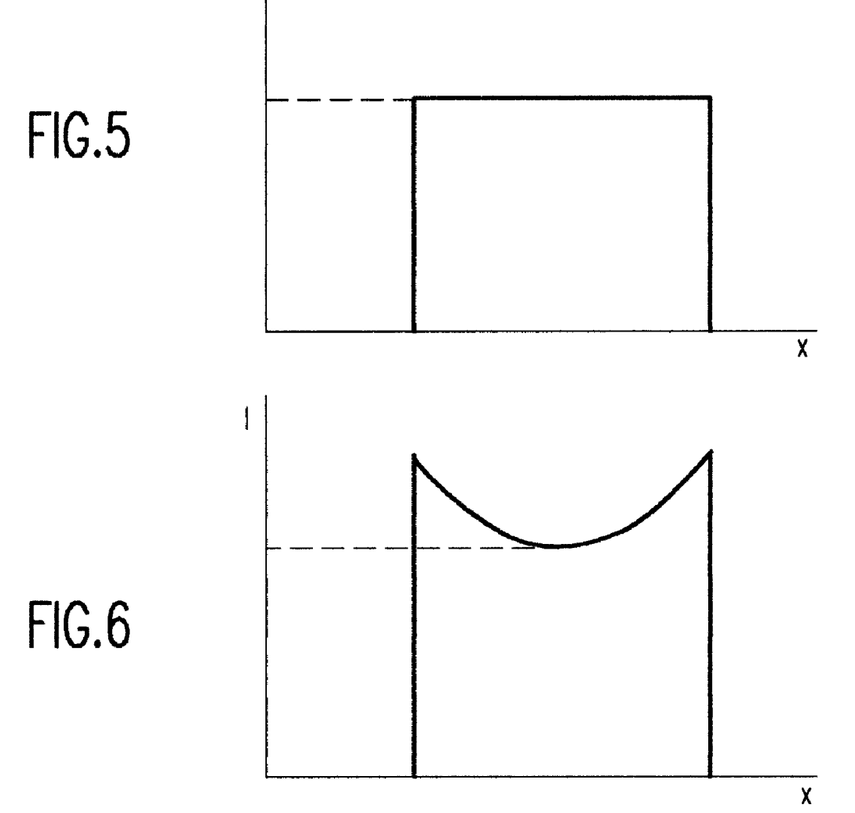
FIG. 5 shows a uniform illumination intensity distribution of an electron beam.
FIG. 6 shows a non-uniform illumination intensity distribution of an electron beam.

FIG. 5 shows a uniform illumination intensity distribution of an electron beam about a subfield of the resist. By using the uniform illumination intensity distribution of FIG. 5, an ideal distribution occurs at the center of the subfield as shown in FIG. 2. However, with this same uniform illumination intensity distribution of FIG. 5, a non-ideal intensity distribution occurs at the edges of the subfield as shown in FIG. 3. Thus, the printed feature width "w" at the center of the subfield will not be the same as the printed feature size width "w'" at the edges of the subfield. Accordingly, the printed feature sizes at the center and edges of the subfield are not uniform thereby degrading the image quality. Likewise, blurring also occurs in the resist as discussed with reference to FIG. 3.

Figure 7:
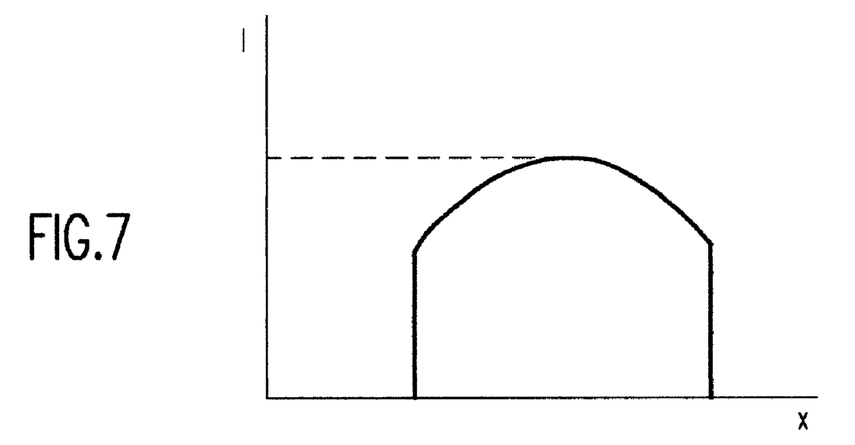
FIG. 7 shows a non-uniform illumination intensity distribution of an electron beam occurring in a subfield of a resist.

FIGS. 6 and 7 show a non-uniform intensity distribution of subfield illumination. In more detail, FIG. 6 shows edges of the subfield having a higher intensity than the center of the subfield; whereas FIG. 7 shows the center of the subfield having a higher intensity than the edges of the electron beam.

By increasing the intensity of the electron beam at the edges (FIG. 6), the feature size about the edges of the subfield are increased relative to feature size when the intensity distribution remains uniform as shown in FIG. 3 and prior art systems. That is, the feature size at the edges of the subfield become equal to the feature size at the center of the subfield (e.g., the feature size width "w" at the center of the subfield of FIG. 2 is the same size as the feature size width "w" at the edges of the subfield of FIG. 4) by increased intensity compensating for blurring, thereby improving image quality on the resist. Thus, by choosing the intensity distribution within the subfield, the systematic variations of the feature size of the patterned image can be eliminated.

FIG. 7 shows an alternative embodiment of the present invention where an increase in the intensity of the subfield at the center of the electron beam (as compared to FIG. 6) is shown. The increased intensity at the center of the subfield is advantageous when compensating for curvature of field situations, such as when the edges of the subfield are focused better than the center of the subfield.

In the preferred embodiment of the present invention, in order to increase or decrease the intensity distribution within an electron beam, the temperature of the cathode or charged particle emitting device (e.g., crystal) is selectively adjusted at edges or the center of the crystal (locally adjusted). This selective temperature adjustment is provided, in the preferred embodiment, by bombarding the crystal with bombardment electron beams on the edges or center of the backside (nonemitting side) of the crystal which, in turn, locally increases or decreases the intensity distribution of the electron beam about the edges or center of the electron beam. Thus, by locally adjusting the temperature of the crystal, the intensity distribution will also be locally adjusted thereby increasing the image fidelity on the resist.

Figure 8A:
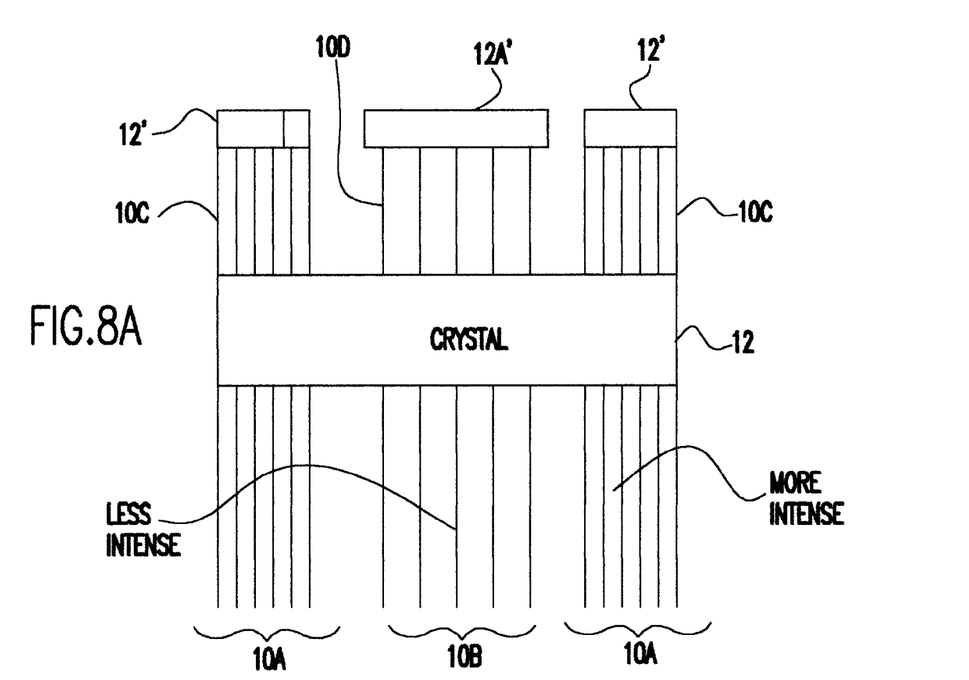
FIGS. 8a and 8b show a bombardment electron beam bombarding electrons on a back surface of a crystal.

FIG. 8a shows an annular cathode 12' and a center cathode 12a' bombarding a backside of the crystal 12 with electron beams 10c, 10d at the edges and center thereof, respectively. The annular cathode 12' emits a more intense bombardment electron beam 10c than the center cathode 12a' (electron beam 10d) such that the edges of the crystal 12 become hotter than the center of the crystal 12. This increases the electron beam intensity 10a emitted from the edges of the crystal 12. The electron beam intensity 10a, 10b provides for equal feature size width "w" at the exposed center and edges of the subfield.

Figure 8B:
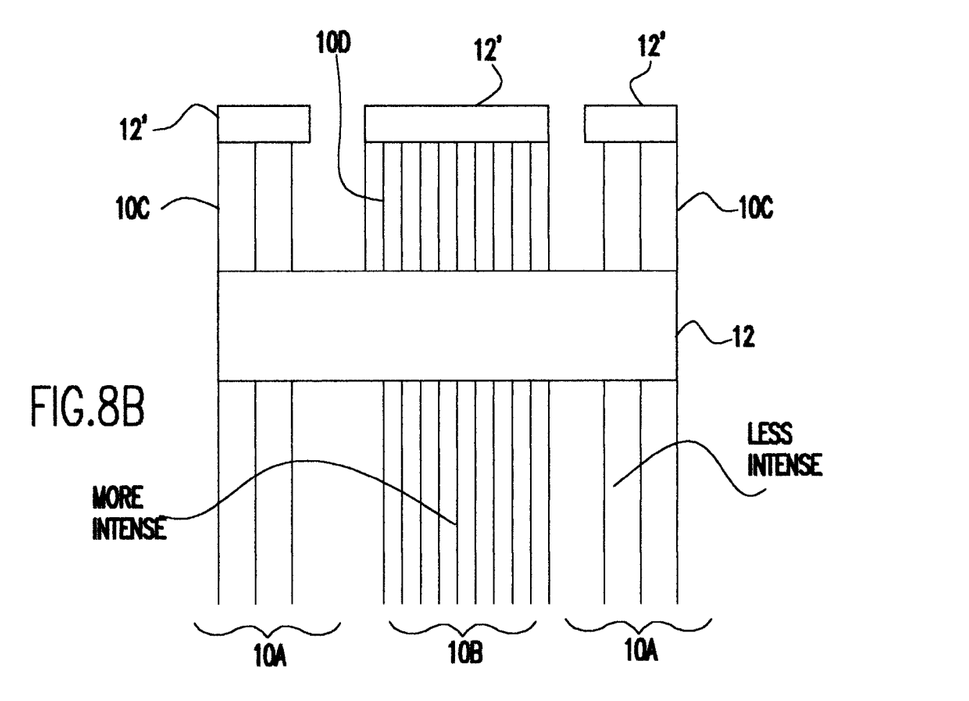

FIG. 8b shows the annular cathode 12' and the center cathode 12a' bombarding the backside of the crystal 12 with electron beams 10c, 10d at the edges and center thereof, respectively. In this embodiment, the center cathode 12a' emits a more intense bombardment electron beam 10d than the annular cathode 12' (electron beam 10c) such that the center of the crystal 12 become hotter than the edges of the crystal 12. This increases the electron beam intensity 1ob emitted from the center of the crystal 12. The electron beam intensity 10a, 10b provides for equal feature size width "w" at the exposed center and edges of the subfield.

In an alternate embodiment to FIG. 8b, a single cathode centered about the center of the crystal 12 may be provided. In this embodiment, only the electron beam 10d will be emitted toward the center of the crystal 12 such that the center of the crystal 12 will be hotter than the edges. This, in turn, will increase the illumination intensity distribution about the center of the electron beam.

In preferred embodiments, the temperature difference between the center and the edge of the electron beam can be adjusted approximately +/−100° K. at any initial temperature range of the crystal 12. In more preferred embodiments, when the center of the crystal 12 is at approximately 1700° K. the preferred temperature of the edges of the crystal 12 is adjusted to 1720° K. However, depending on the particular crystal being used and the initial temperature of the crystal, the temperature at the edges as well as the center of the crystal can be adjusted accordingly by simply adjusting the electron intensity of the crystal 12', 12".

It is further noted that the emissivity of commonly used crystals are well known and behave in a predictable manner, and that an increase or decrease in temperature of the crystal produces a corresponding and proportional increase or decrease in the emissivity of the crystal. This, in turn, produces a corresponding and proportional increase or decrease in the intensity of the electron beam emitted from the crystal. Thus, by knowing the line width produced in one or a relatively few test patterns, one of skill in the art can extrapolate and/or interpolate from that test line width an appropriate intensity distribution in order to obtain a predetermined line width in a subfield of a resist.

As an advantage of the present method the illumination intensity can be changed, in process, to "tune-out" unexpected errors; whereas, in contrast, other systems must stop the entire process in order to adjust for various feature sizes. This greatly increases manufacturing costs and time which is avoided by the present invention.

Figure 9:
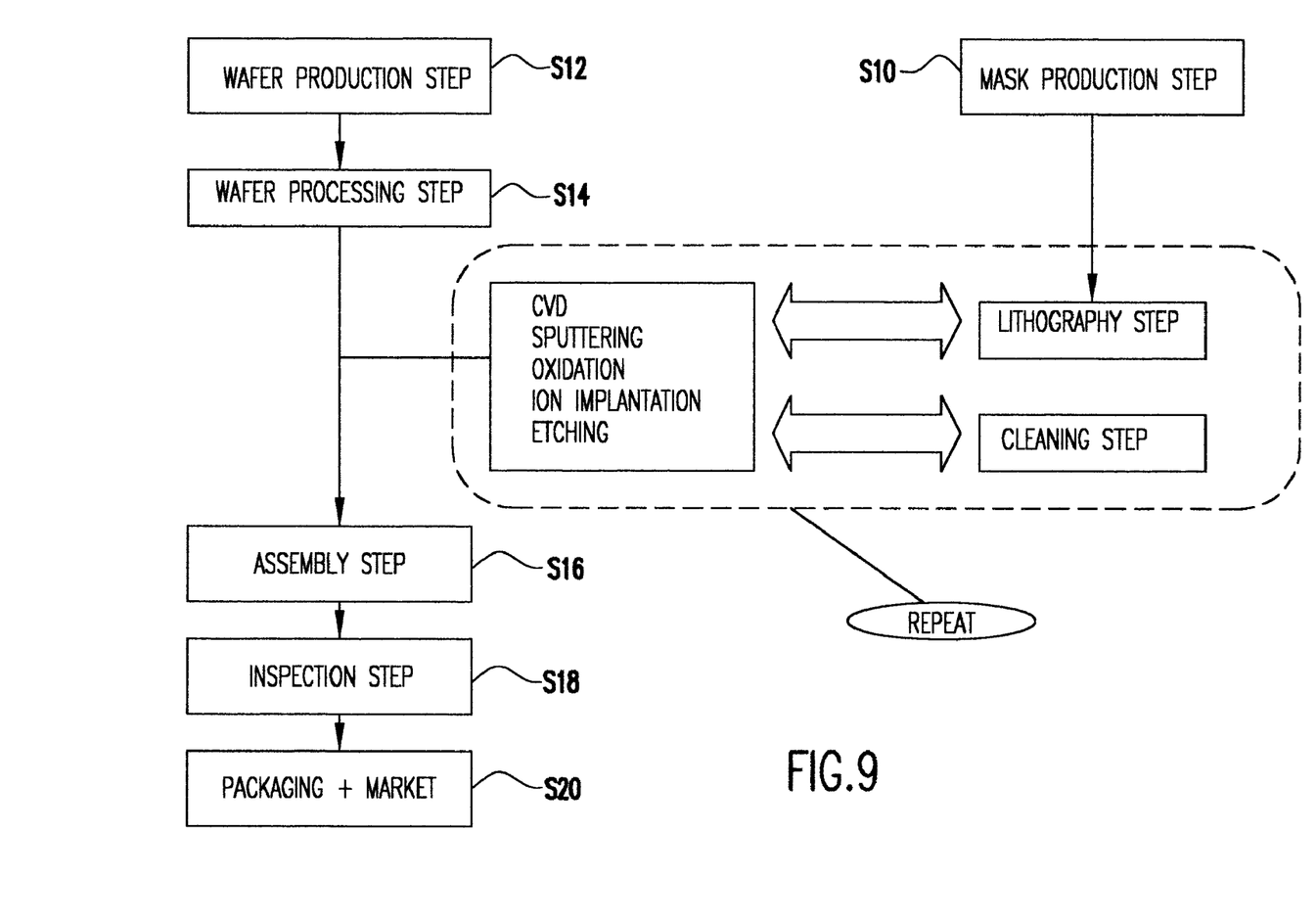
FIG. 9 shows a general overview of the fabrication process of a semiconductor device.

FIG. 9 shows a generalized flow diagram providing an overview of the fabrication process for a semiconductor device (or apparatus) utilizing the invention. It is well understood by one of ordinary skill in the art that FIG. 9 may equally represent a high level block diagram of a fabrication process of a semiconductor device. It is also well understood that the high level block diagram represents a preferred although generalized fabrication method and that other fabrication methods may be equally used with the present invention. Details of particular fabrication methods are unimportant to the practice of the invention; however, at least one lithographic exposure is invariably required to determine device locations and dimensions. When the lithographic process is carried out in accordance with the invention described above, more accurately located patterns can be achieved consistent with high throughput in manufacture of integrated circuits of increased functionality and improved performance, which are not otherwise producible with other currently known lithographic techniques that do not include utilization of the invention.

Referring now to FIG. 9, the semiconductor device fabrication begins with a mask fabrication at step S10. The mask fabrication comprises patterning a mask by known methods such as, for example, resist coating, electron beam or electromagnetic energy exposure, development, etching, resist stripping and the like. Upon completion of the mask fabrication, the mask is inspected and corrections to the mask are made, if necessary. In order to correct any defects that may be present in the mask, the patterning of the mask would again be performed subsequent to inspection. The finished mask (or reticle) is then used for wafer processing at step S14.

Wafer fabrication typically comprises growing a single crystal and performing mechanical processes on the grown crystal. These mechanical processes may include, for example, slicing or cutting a wafer and rounding the edges. The wafer is then polished and well known thermal processing is performed thereon as may be desired, for example, to getter impurities and or contaminants, repair crystal damage or the like. Thereafter, the wafer is inspected for defects.

Once the wafer is fabricated and only a predetermined small amount of tolerable defects are found, wafer processing begins at step S14. Wafer processing includes providing a thin film on a wafer for providing a circuit element. The thin film may be formed on the wafer by, for example, evaporation or sputtering deposition, CVD (chemical vapor deposition), ion implantation and the like depending on the intended material of the film. Once the thin film is deposited on the wafer, modification to the thin film is performed in order to provide the thin film with certain defined electrical properties, if necessary. The modification of the thin film may include, for example, etching to form circuit patterns, oxidation to form an insulator or doping to control conductivity. Doping may be performed by any well known method such as ion implantation, thermal diffusion, deposition of a doped film and the like.

It is well understood by one skilled in the art, that the wafer may be washed after the wafer process (e.g., etching, deposition, implantation and the like). It is also understood that several processing steps, such as, for example, two or more CVD processing steps or the like may be performed, and that the washing of the wafer may be performed between each of these individual processing steps, if desired. The washing and processing of the wafer may be repeated any number of times, and is limited only by the design and intended use and function of the finished device.

The thin film is patterned using the mask fabricated in step S10. The patterning of the thin film includes exposing the resist layer, via a lithographic process (e.g., charged particle exposure), to form a latent image on the resist. The charged particle exposure is discussed in detail with reference to FIG. 10. It is further well understood that the charged particle exposure selectively modifies the resist in a predetermined pattern by altering the chemical composition of the resist. The resist is then developed to form a pattern in accordance with the exposure and inspected for any defects.

The invention, by providing for uniform feature size throughout the subfield, particularly in comparison with the uniform incident intensity distribution within the subfield of prior e-beam lithographic systems, compensates for naturally occurring aberrations and eliminates the deleterious effect of blurring in a resist image, thereby providing increased resist image fidelity to a degree not previously attainable. This meritorious advantage of the present invention is accomplished by intentionally increasing the incident intensity where the images are small (more pronounced blurring) and intentionally decreasing the incident intensity where the images are large (less pronounced blurring).

The invention thus improves manufacturing yields and thus provides improved lithographic patterning substantially free of irregularities as would be determined by inspection after resist development. After inspection, the wafer is baked to stabilize the resist pattern, and after the desired processing (e.g., etching, deposition, implantation and the like), the resist may be stripped and the wafer washed, if necessary.

The charged particle exposure associated with step S14 may be repeated any number of times in order to provide numerous thin film layers having certain defined electrical properties in patterned areas of each such layer. Moreover, the wafer may be washed after each individual charged particle exposure process. Depending on the specific application, the wafer may then be coated with an insulative layer and provided with a contact hole (e.g., through hole).

In step S16, the patterned wafer is assembled into a device. This process includes testing, inspecting and dicing the wafer, and providing bonding to the chips diced from the wafer. Bonding includes connecting a lead wire for connection to an electrode, semiconductor device or other component. The assembled semiconductor chip is then packaged (e.g., sealed) to stabilize the semiconductor chip and inspected for any defects. In step S18, the assembled semiconductor chip is inspected and tested, and introduced into the marketplace in step S20.

Figure 10:
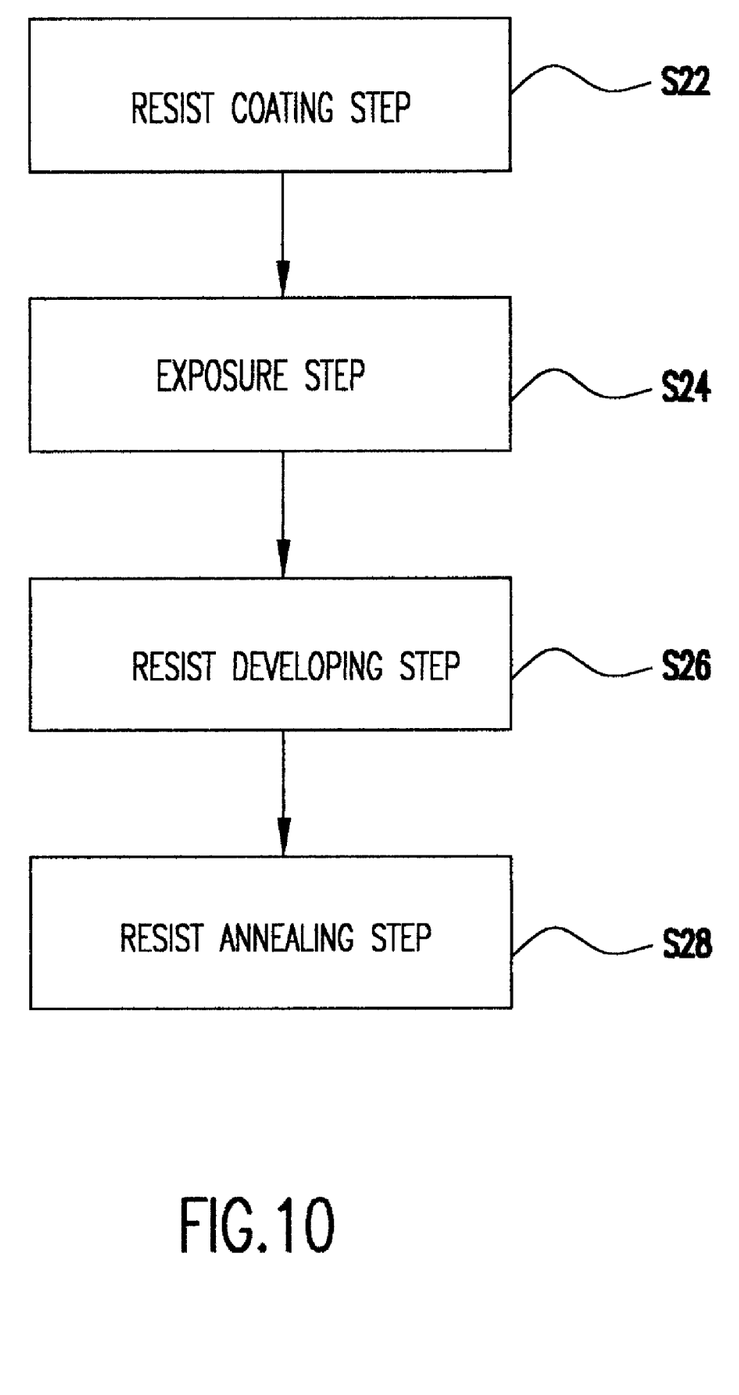
FIG. 10 shows the detailed process of resist pattern formation.

FIG. 10 shows the detailed process of resist pattern formation as shown with relation to the resist pattern formation of step S14 of FIG. 9. As is well understood by those of ordinary skill in the art, the lithographic process of steps S22–S26 is invariably included to define latent images on the resist, and that the patterning of the resist is critical to the overall design of the device regardless of the technology that may be used to develop such latent images on the resist since the location and basic dimensions of electron elements and conductors are established thereby. To this end, at step S22, the step of resist coating is shown. At step S24, the resist is exposed to electron means utilizing the mask formed in step S10 of FIG. 9 with greatly improved accuracy of exposure location through utilization of the invention. This exposure is performed, for example, by an electron beam stepper device in which the invention may be installed. At step S26, the resist is developed to form a pattern in accordance with the exposure of step S24. At step S26, the resist in then annealed. Once such a pattern is formed, the semiconductor fabrication process continues as described above.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of improving image fidelity on a surface of a wafer comprising the step of adjusting an intensity distribution of an electron beam focused on a subfield of the wafer such that the intensity distribution of the electron beam is non uniform between portions of the subfield.

2. The method of claim 1, wherein the adjusting step includes increasing the intensity distribution of the electron beam about edges of the electron beam.

3. The method of claim 1, wherein the adjusting step includes increasing the intensity distribution of the electron beam about a center of the electron beam.

4. The method of claim 1, wherein the adjusting step includes increasing a temperature about edges of a crystal or cathode emitting the electron beam focused on the subfield such that the edges of the crystal or cathode are hotter than a center of the crystal or cathode, thereby increasing the intensity distribution of the electron beam about an edge of the electron beam.

5. The method of claim 4, wherein the feature size at a center and edges of the subfield are a same size.

6. The method of claim 4, further comprising emitting a bombardment electron beam on a non emitting surface of the crystal in order to increase the temperature about the edges of the crystal.

7. The method of claim 6, wherein the bombardment electron beam is emitted onto the edges of the non emitting surface of the crystal.

8. The method of claim 1, wherein the adjusting step includes increasing a temperature about a center of a crystal or cathode emitting the electron beam focused on the subfield such that the center of the crystal or cathode is hotter than edges of the crystal or cathode, thereby increasing the intensity distribution of the electron beam about the center of the electron beam.

9. The method of claim 8, further comprising emitting a bombardment electron beam on the center of a non emitting surface of the crystal in order to increase the temperature about the center of the crystal.

10. The method of claim 1, wherein a feature size at a center and edges of the subfield of the wafer are of a same size when the intensity distribution of the electron beam about edges or a center of the electron beam is adjusted.

11. The method of claim 1, wherein the adjusting step increases an intensity of the electron beam thereby increasing a feature size at edges or a center of the subfield of the wafer.

12. The method of claim 1, wherein the adjusting step increases an incident intensity at patterned images on the wafer of a first size, and decreases the incident intensity at patterned images of a second size, the first size is smaller than the second size.

13. The method of claim 1, wherein the adjusting step includes raising an intensity of the electron beam to above a predetermined threshold intensity level at edges of the electron beam such that feature size at edges and a center of the subfield are all a same size.

14. The method of claim 1, wherein the adjusting step includes providing bombardment electron beam at a center and edges of a crystal or cathode emitting the electron beam focused on the subfield such that the bombardment electron beam at the center is more intense than the bombardment electron beam at the edges, and the bombardment electron beam increases the temperature at a center of the crystal or cathode such that the center is hotter than edges of the crystal or cathode, thereby increasing the intensity distribution of the electron beam about the center of the electron beam.

15. The method of claim 1, wherein the adjusting step includes providing bombardment electron beam at a center and edges of a crystal or cathode emitting the electron beam focused on the subfield such that the bombardment electron beam at the edges is more intense than the bombardment electron beam at the center, and the bombardment electron beam increases the temperature at edges of the crystal or cathode such that the edges are hotter than a center of the crystal or cathode, thereby increasing the intensity distribution of the electron beam about the edges of the electron beam.

16. A method of adjusting a feature size on a subfield of a wafer comprising the step of adjusting a temperature of a charged particle emitting device emitting an electron beam focused on the subfield such that the intensity distribution of the electron beam is non uniform between portions of the subfield.

17. The method of claim 16, wherein the adjusting step includes increasing the temperature at edges of the charged particle emitting device thereby increasing the intensity distribution of the electron beam about edges of the electron beam.

18. The method of claim 16, wherein the adjusting step includes increasing the temperature at a center of the charged particle emitting device thereby increasing the intensity distribution of the electron beam about a center of the electron beam.

19. The method of claim 16, wherein a feature size at a center and edges of the subfield of the wafer are a same size when the intensity distribution of the electron beam about the edges or the center of the electron beam is adjusted.

20. The method of claim 16, further comprising emitting a secondary electron beam on a non emitting surface of the charged particle emitting device in order to increase the temperature about edges or a center of the crystal.

21. The method of claim 16, wherein the adjusting step increases the energy of the electron beam thereby increasing a feature size at edges of the subfield of the wafer.

22. A method of fabricating an electronic device including exposing a resist layer on a semiconductor material by charged particle beam lithography, wherein the exposing step includes projecting an electron beam of charged particles of a first intensity distribution on edges of the resist layer, and projecting an electron beam of charged particles of a second intensity distribution on a center portion of the resist layer, wherein the first intensity distribution is different than the second intensity distribution.

23. The method of claim 22, wherein the first intensity distribution is greater than the second intensity distribution.

24. The method of claim 23, further comprising increasing a temperature about edges of a crystal or cathode emitting the electron beam of charged particles of the first intensity distribution such that the edges of the crystal or cathode are hotter than a center of the crystal or cathode, thereby increasing the first intensity distribution with respect to the second intensity distribution.

25. The method of claim 22, wherein the first intensity distribution is less than the second intensity distribution.

26. The method of claim 25, further comprising increasing a temperature about a center portion of a crystal or cathode emitting the electron beam of charged particles of the second intensity distribution such that the center portion of the crystal or cathode is hotter than edges of the crystal or cathode, thereby increasing the second intensity distribution with respect to the first intensity distribution.

* * * * *